(12) United States Patent
Kimura

(10) Patent No.: US 8,017,918 B2
(45) Date of Patent: Sep. 13, 2011

(54) CHARGED-PARTICLE BEAM INSTRUMENT

(75) Inventor: Atsushi Kimura, Tokyo (JP)

(73) Assignee: JEOL Ltd., Tokyo (JP)

( * ) Notice: Subject to any disclaimer, the term of this patent is extended or adjusted under 35 U.S.C. 154(b) by 535 days.

(21) Appl. No.: 12/190,928

(22) Filed: Aug. 13, 2008

(65) Prior Publication Data
US 2009/0045337 A1 Feb. 19, 2009

(30) Foreign Application Priority Data
Aug. 14, 2007 (JP) .................................. 2007-211580

(51) Int. Cl.
*G21K 5/02* (2006.01)
*H01J 37/26* (2006.01)
(52) U.S. Cl. ............ 250/396 ML; 250/396 R; 250/306; 250/310; 250/311; 430/296
(58) Field of Classification Search .................. 250/306, 250/307, 309, 310, 311, 396 R, 396 ML; 430/296, 297, 298
See application file for complete search history.

(56) References Cited

U.S. PATENT DOCUMENTS

| | | | |
|---|---|---|---|
| 7,501,638 B1* | 3/2009 | Zhou | 250/396 R |
| 2006/0043289 A1* | 3/2006 | West | 250/309 |
| 2006/0169897 A1* | 8/2006 | Andrews et al. | 250/310 |
| 2006/0255269 A1* | 11/2006 | Kawasaki et al. | 250/310 |
| 2009/0114818 A1* | 5/2009 | Casares et al. | 250/307 |

FOREIGN PATENT DOCUMENTS
JP 2003-187735 7/2003
* cited by examiner

*Primary Examiner* — Robert Kim
*Assistant Examiner* — Nicole Ippolito Rausch
(74) *Attorney, Agent, or Firm* — The Webb Law Firm

(57) ABSTRACT

A charged-particle beam instrument (such as a transmission electron microscope) which facilitates modifying the diameters of aperture stops installed above and below (on the beam entrance and exit sides) the specimen chamber and exchanging the aperture stops. The instrument has bottom polepieces forming the specimen chamber, aperture stops each having plural holes, pushing mechanisms for pushing the aperture stops against the polepieces and supporting the stops, and stop drive mechanisms for sliding the aperture stops in a direction perpendicular to the path of the beam in response to a manipulation performed outside the electron optical column. The aperture stops are made of a metal foil or sheet and provide a cover over the opening of at least one beam passage hole in the polepieces that faces into the specimen chamber.

4 Claims, 9 Drawing Sheets

CHARGED-PARTICLE BEAM INSTRUMENT

BACKGROUND OF THE INVENTION

1. Field of the Invention

The present invention relates to a charged-particle beam instrument, such as a transmission electron microscope (TEM), for observing or analyzing a specimen by irradiating the specimen accommodated in a specimen chamber with an electron beam. More specifically, the present invention relates to a charged-particle beam instrument permitting one to observe the process of a reaction of a specimen with a gas when the specimen is placed in an ambient of the gas.

2. Description of Related Art

A charged-particle beam instrument, such as a transmission electron microscope (TEM), is sometimes required to make in situ dynamic observation of a specimen placed in an ambient of a gas. For example, in the field of research on catalysts, dynamic observation of a process in which particles of a catalyst react with a gas and undergo changes plays a great role in improving the catalyst. Furthermore, it is expected that making a dynamic observation to understand how a material is varied by a gas will be helpful to research on corrosion of the material, for example, due to environmental pollution gases and to improvements of the material. Furthermore, in observations of biological specimens, if a specimen is placed in a vacuum, the specimen dries. Therefore, observing a specimen after it has been placed in a given ambient gas is an important technique.

Where a specimen is placed in an ambient of a gas and observed dynamically with an electron microscope by the prior art technique, the used electron microscope is a specially designed microscope in which the specimen chamber itself of the microscope is a chamber containing a gaseous ambient as described in JP-A-2003-187735.

FIG. 7 is a vertical cross section of the electron optical column of a conventional transmission electron microscope (TEM) that is one kind of charged-particle beam instrument.

As shown in FIG. 7, the electron optical column indicated by reference numeral 101 is made of a substantially cylindrical outer cylinder 102. If necessary, the inside of the outer cylinder 102 is partitioned into discrete zones by partition walls. Near the center axis of the electron optical column 101, the portions constituting a flight path 105 of an electron beam 103 form an axially continuous space that is evacuated to a vacuum.

An electron source 104 is mounted inside the electron optical column 101 and emits the electron beam 103. A condenser lens 106, an objective lens 107, and other electron lenses for diffusing and converging the electron beam 103 utilizing magnetic or electric fields are incorporated in the electron optical column 101. Furthermore, an aperture stop 108 for removing unwanted electrons and shaping the electron beam 103 is mounted in the electron optical column 101. An aperture stop driver 109 for adjusting the position of the aperture stop 108 is also mounted in the column. A specimen holder 111 that is a stage on which a specimen 110 to be observed and analyzed is placed is also mounted in the column. A specimen holder driver 112 for adjusting the position of the specimen holder 111 is also mounted in the column.

The specimen holder 111 has a front-end portion placed within the specimen chamber 113 that is located within the electron optical column 101. The specimen 110 is introduced into the specimen chamber 113, where observation and analysis are performed. Normally, the specimen chamber 113 is formed inside the objective lens 107.

FIG. 8 is a vertical cross section showing the configuration of the objective lens 107 of the conventional transmission electron microscope (TEM). The objective lens 107 is made up of a yoke 114, an excitation coil 115, and a polepiece assembly 116 inside the outer cylinder 102 as shown in FIG. 8. The yoke 114 is made of a material having a high magnetic permeability. The yoke is fabricated by closing the upper and lower ends of a double cylinder. An upper portion of the inner cylinder has been cut out. A beam passage hole 117 is formed in the center of the yoke 114 and extends in the up-and-down direction. The electron beam 103 passes through the passage hole 117. The excitation coil 115 is received between the two cylinders of the yoke 114. The coil 115 is fabricated by cylindrically winding many turns of a metal wire, such as a copper wire, coated with an insulator.

The polepiece assembly 116 of the objective lens is made of a material having a high magnetic permeability, and is shaped substantially cylindrically. The polepiece assembly 116 is made up of a top polepiece 118, a bottom polepiece 119, and a spacer 120 made of a nonmagnetic material, such as a copper alloy. Each of the top polepiece 118 and bottom polepiece 119 has a protrusive portion obtained by trimming away a conic top portion. The protrusive portions of the top polepiece 118 and the bottom polepiece 119 are opposite to each other and spaced apart a given distance. The top polepiece 118 and bottom polepiece 119 have beam passage holes 121 and 122, respectively, permitting passage of the electron beam 103. The holes 121 and 122 extend in the up-and-down direction. The spacer 120 connects the top polepiece 118 and the bottom polepiece 119 while maintaining the space between them. The polepiece assembly 116 of the objective lens is mounted in an upper cutout portion of the inner cylinder of the yoke 114.

In the transmission electron microscope, a specimen 110 is inserted in the specimen chamber 113 and observed or analyzed, the chamber 113 being located between the opposite top polepiece 118 and bottom polepiece 119. The position at which the specimen 110 is installed can be termed the specimen observation position 123. Inside the yoke 114, a specimen stage 124 made of a nonmagnetic material is mounted at a side of the specimen chamber 113. Plural connection flanges 125 radially extend through the outer cylinder 102 and yoke 114 on the side of the outer periphery of the specimen stage 124. The specimen holder driver 112 and pipes (not shown) for vacuum pumping are held to the connection flanges 125.

The specimen stage 124 is provided with a hole 126 extending through it. The hole 126 is formed to extend toward the specimen observation position 123. The specimen holder 111 can be introduced via the hole 126 to bring the specimen 110 into the observation position 123 or the observation position 123 can be evacuated to a vacuum. If necessary, a through-hole 127 for the specimen holder 111 is formed in a side portion of the spacer 120.

Required connected portions of the components of the objective lens 107 are hermetically sealed with O-rings 128, 129, 130, 131, 132, and 133. The space around the specimen observation position 123 is maintained as a vacuum. The space including the observation position 123 and maintained as a vacuum is referred to as the specimen chamber 113.

In the objective lens 107, the specimen chamber 113 is evacuated to a vacuum via the through-hole 126 in the specimen stage 124. The spaces above and below the polepiece assembly 116 of the objective lens are also evacuated to a vacuum with other vacuum pumping piping (not shown). In this case, all vacuum pipes branch off from the same main pipe. The beam passage holes 121 and 122 formed in the top polepiece 118 and bottom polepiece 119 are sufficiently large and so the degree of vacuum is substantially uniform from location to location.

FIG. 9 is a vertical cross section showing the structures of main portions of an objective lens 107' incorporated in a transmission electron microscope (TEM) having a conventional specimen chamber containing an ambient of a gas. This objective lens 107' has a top polepiece 118 and a bottom polepiece 119 provided with beam passage holes 121 and 122, respectively, as shown in FIG. 9. Aperture stops 135, 136, 137, and 138 may be mounted above and below (locations closer to and remote from the specimen 110) the beam passage holes 121 and 122. Each aperture stop is a disk made of a nonmagnetic metal centrally provided with a small orifice. The aperture stops 135 and 136 closer to the specimen 110 are referred to as the first upper aperture stop and the first lower aperture stop, respectively. The aperture stops 137 and 138 further from the specimen are referred to as the second upper aperture stop and the second lower aperture stop, respectively. Each aperture stop is mounted to the top polepiece 118 and bottom polepiece 119 such that the connections are made as hermetic as possible. For example, each aperture stop is bonded with a conductive adhesive.

In this case, the space formed between the first upper aperture stop 135 and the second upper aperture stop 137 is referred to as the upper intermediate chamber 139. The space formed between the first lower aperture stop 136 and the second lower aperture stop 138 is referred to as the lower intermediate chamber 140. The upper intermediate chamber 139 is in communication with the vacuum space located above the polepiece assembly 116 of the objective lens and with the specimen chamber 113 only via small aperture holes 141 formed in the second upper stop 137 and first upper aperture stop 135. Similarly, the lower intermediate chamber 140 is in communication with the vacuum space located below the polepiece assembly 116 of the objective lens and with the specimen chamber 113 only via small aperture holes 141 formed in the second lower aperture stop 138 and first lower aperture stop 136.

An upper differential pumping tube 142 and a lower differential pumping tube 143 extend through the outer cylinder 102, yoke 114, specimen stage 124, and spacer 120 and are connected with the upper intermediate chamber 139 and lower intermediate chamber 140, respectively. Required portions are kept hermetic with O-rings 144.

In the objective lens 107', the pumping system for evacuating the specimen chamber 113 is separate from the upper differential pumping tube 142 and lower differential pumping tube 143 which evacuate the upper intermediate chamber 139 and lower intermediate chamber 140, respectively. The pumping system for evacuating the specimen chamber 113 is separate from pumping systems for evacuating the spaces located above and below the polepiece assembly 116 of the objective lens. The aperture holes 141 are present among the specimen chamber 113, upper intermediate chamber 139, lower intermediate chamber 140, and the spaces located above and below the polepiece assembly 116 of the objective lens. Because admission and venting of gas are limited, pressure differences can be created among the spaces. Accordingly, in the objective lens 107', a trace amount of arbitrary gas can be introduced into the specimen chamber 113 through the specimen stage 124 such that the degrees of vacuum in the spaces located above and below the polepiece assembly 116 of the objective lens are hardly affected. The specimen 110 can be observed and analyzed under arbitrary gaseous environments.

The above-described charged-particle beam instrument has the problem that it is difficult to exchange the first upper aperture stop 135 and first lower aperture stop 136. That is, if the diameter of the aperture hole 141 is varied or if contamination has occurred due to the charged-particle beam, it is necessary to exchange the first upper aperture stop 135 and first lower aperture stop 136. However, the first upper aperture stop 135 and first lower aperture stop 136 are adhesively bonded to the sides of the top polepiece 118 and bottom polepiece 119 facing the specimen chamber 113. Therefore, it is impossible to exchange them unless the polepiece assembly 116 of the objective lens is taken out, for example, by disassembling the electron optical column 101. Consequently, it is difficult to exchange the first aperture stops. In addition, there is the problem that it is impossible to adjust the positions of the first upper aperture stop 135 and first lower aperture stop 136 or to vary the diameter during microscopic examination.

Additionally, the charged-particle beam instrument has the problem that it is difficult to maintain the accuracy of the positions at which the first upper aperture stop 135 and first lower aperture stop 136 are mounted. In particular, the first aperture stops 135 and 136 are held in position after the polepiece assembly 116 of the objective lens has been taken out of the electron optical column 101. Hence, it is difficult that their positions within the electron optical column 101 are previously checked and that the first aperture stops are placed in position.

Moreover, in this charged-particle beam instrument, the first aperture stops 135 and 136 are kept on the passage of the electron beam 103. Therefore, there is the problem that it is difficult to use the instrument if a method not using the aperture stops 135 and 136 is employed. That is, when it is necessary to remove the first aperture stops 135 and 136, the polepiece assembly 116 of the objective lens must be taken out, for example, by disassembling the electron optical column 101.

SUMMARY OF THE INVENTION

Accordingly, the present invention has been proposed in view of the foregoing circumstances. It is an object of the present invention to provide a charged-particle beam instrument, such as a transmission electron microscope (TEM), that facilitates varying the diameters of aperture stops installed above and below (i.e., on the beam entrance side and exit side) a specimen chamber and exchanging the aperture stops.

A charged-particle beam instrument associated with the present invention is used to observe or analyze a specimen by receiving the specimen in a specimen chamber formed in an electron optical column and irradiating the specimen with an electron beam. According to one embodiment, the charged-particle beam instrument has: top and bottom polepieces disposed on the beam entrance side and exit side, respectively, of the specimen chamber and is provided with beam passage holes, the top and bottom polepieces forming the specimen chamber; an upper aperture stop made of metal foil or sheet having plural holes, the upper aperture stop being located on a side of an opening end of the beam passage hole in the top polepiece that faces into the specimen chamber, the top polepiece being located on the beam entrance side of the specimen chamber; a first pushing mechanism for pushing the upper aperture stop toward the top polepiece and supporting the upper aperture stop, the pushing mechanism stopping from pushing the upper aperture stop toward the top polepiece in response to a manipulation performed outside the electron optical column; an upper stop drive mechanism for sliding the upper aperture stop in a direction perpendicular to a path of the electron beam in response to a manipulation performed outside the electron optical column; a lower aperture stop made of metal foil or sheet having plural holes, the lower aperture stop being located on a side of an opening end of the beam passage hole in the bottom polepiece that faces into the specimen chamber, the bottom polepiece being located on the beam exit side of the specimen chamber; a second pushing mechanism for pushing the lower aperture stop toward the bottom polepiece and supporting the lower aperture stop, the second pushing mechanism stopping from pushing the lower aperture stop toward the bottom polepiece in response to a manipulation performed outside the electron optical column; and a lower aperture stop drive mechanism for sliding the lower aperture stop in the direction perpendicular to the path of the electron beam in response to a manipulation performed outside the electron optical column.

In the charged-particle beam instrument according to one embodiment of the present invention, the upper and lower aperture stops are stopped from pushing the first and second pushing mechanisms against the polepieces when a manipulation is performed outside the electron optical column. The stop drive mechanisms slide the aperture stops in the direction perpendicular to the path of the electron beam. The beam passage holes can be switched between a mode in which the holes are narrowed and a mode in which the holes are opened without breaking the vacuum in the specimen chamber. That is, the inside of the specimen chamber can be switched between a vacuum state and a desired gaseous ambient by performing an operation outside the electron optical column.

In this charged-particle beam instrument, one of the holes in the stops can be selected by performing an operation outside the electron optical column. During differential pumping, the conductance can be adjusted. Where the aperture stops are contaminated, the aperture stops can be exchanged or the used aperture stop can be switched. Furthermore, in the charged-particle beam instrument, the positions of the aperture stops can be adjusted accurately by performing an operation outside the electron optical column.

In addition, in the charged-particle beam instrument, the aperture stops are supported by the stop drive mechanisms. Consequently, the aperture stops can be taken out of the electron optical column without disassembling the column.

That is, the present invention provides a charged-particle beam instrument, such as a transmission electron microscope (TEM), that facilitates varying the diameters of aperture stops installed above and below (i.e., beam entrance side and exit side) the specimen chamber and exchanging the aperture stops.

Other objects and features of the invention will appear in the course of the description thereof, which follows.

DESCRIPTION OF THE PREFERRED EMBODIMENTS

The preferred embodiments of the present invention are hereinafter described with reference to the accompanying drawings.

First Embodiment

A charged-particle beam instrument associated with the present invention comprises a transmission electron microscope (TEM). The inside of the specimen chamber is differentially pumped to place the specimen into a desired ambient of a gas. Thus, the instrument permits in situ dynamic observation of images of the specimen. In this embodiment, the charged-particle beam instrument associated with the present invention is built as a transmission electron microscope (TEM).

Figure 7:
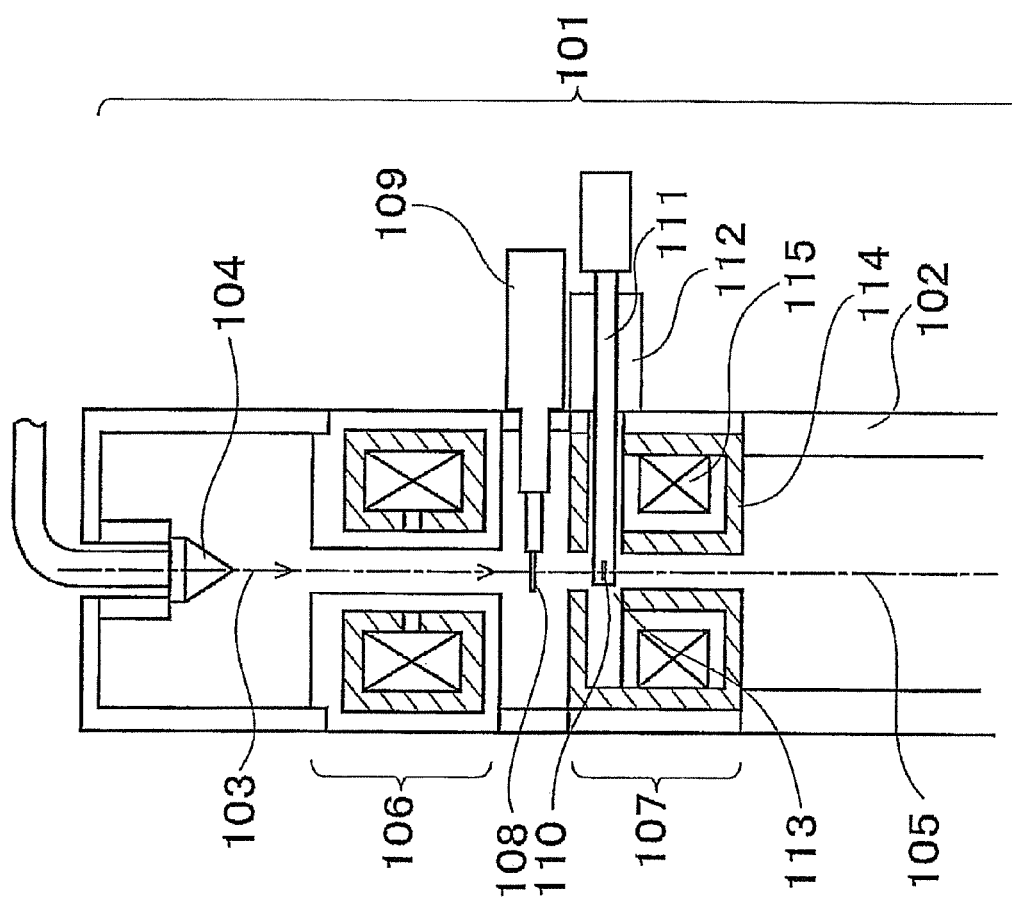
FIG. 7 is a vertical cross section of the electron optical column of a conventional transmission electron microscope.
Figure 8:
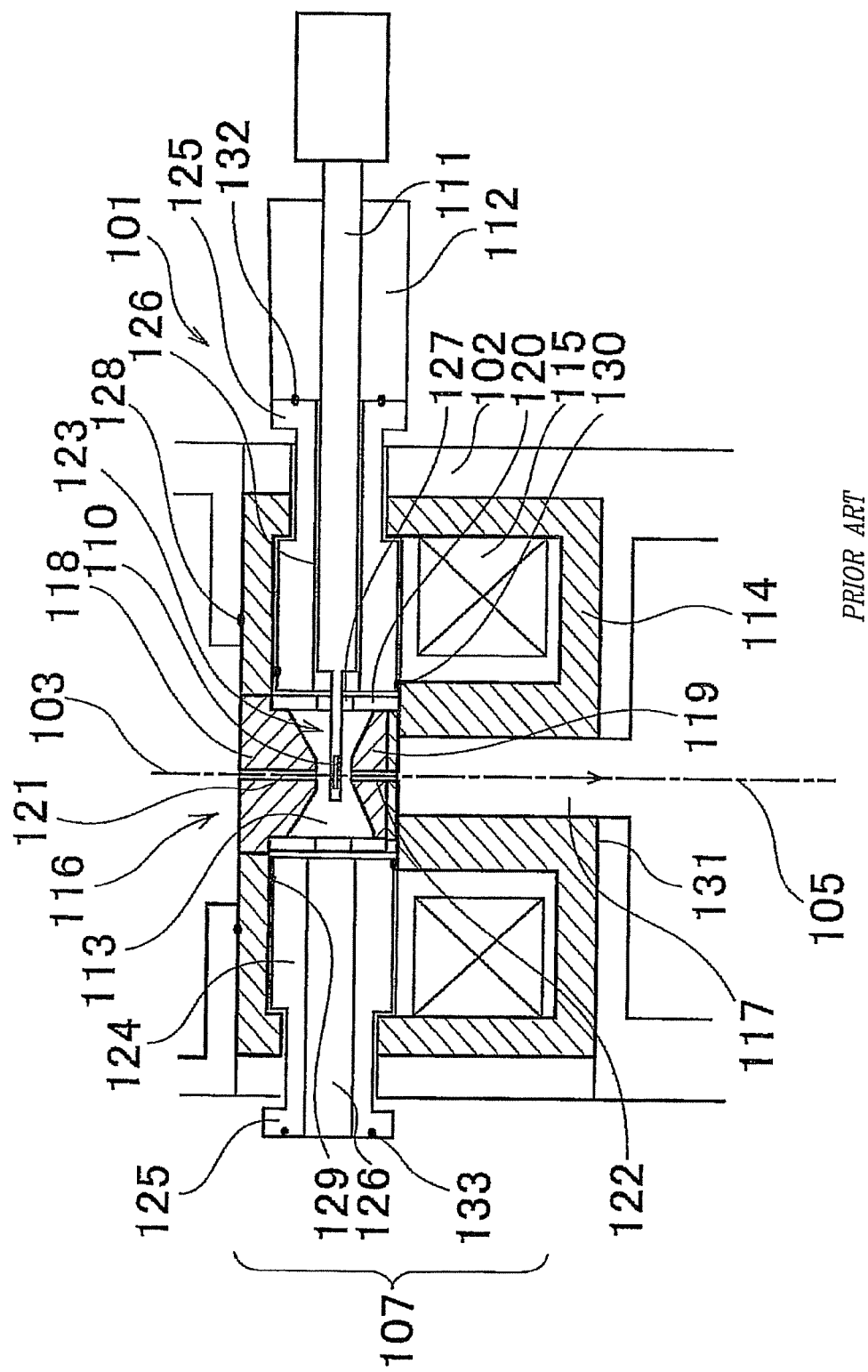
FIG. 8 is a vertical cross section of the objective lens of the conventional transmission electron microscope showing the structure of the objective lens.
Figure 9:
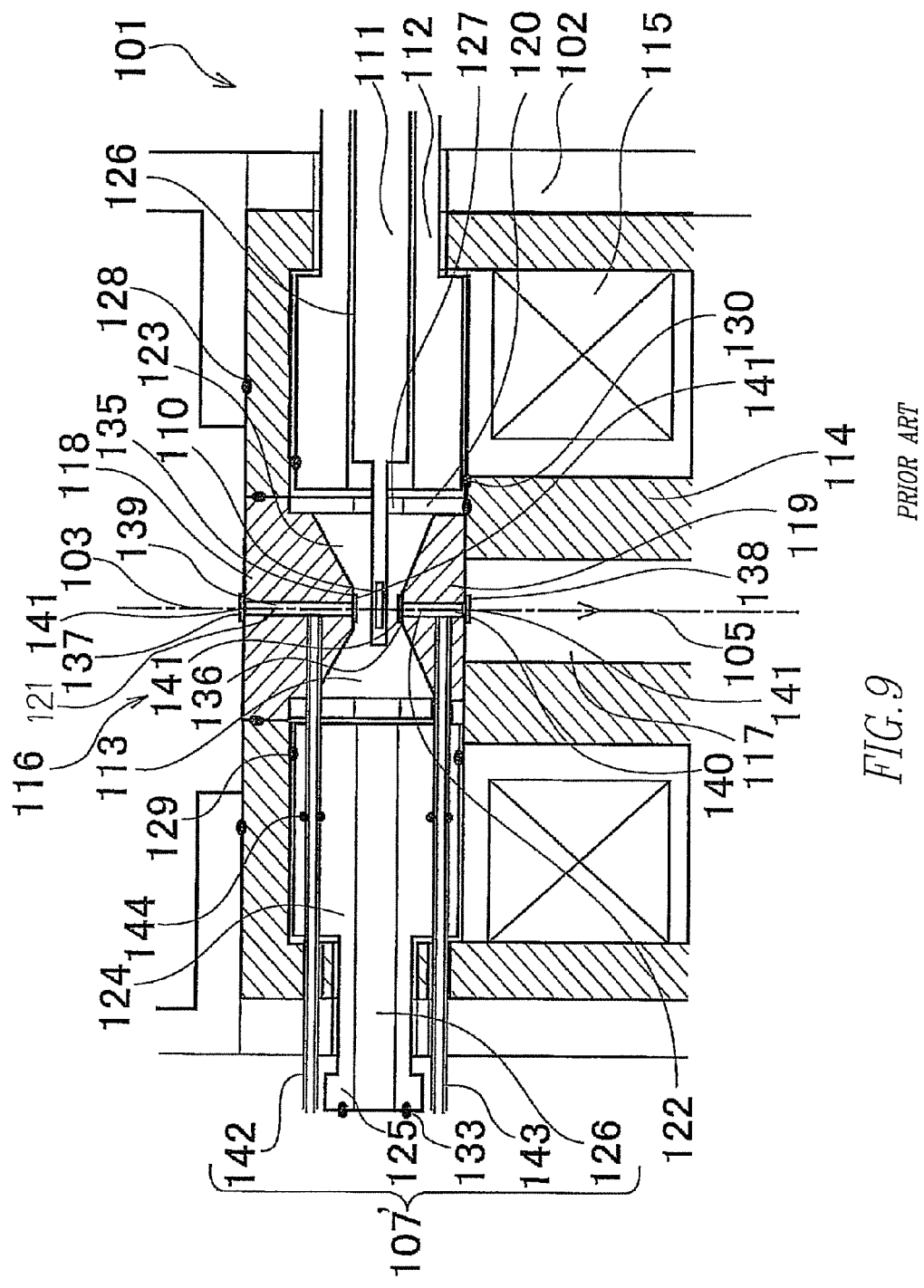
FIG. 9 is a vertical cross section of main portions of the objective lens of the conventional transmission electron microscope showing the structures of the main portions.

The charged-particle beam instrument has an electron optical column 101 in the same way as the conventional charged-particle beam instrument already described in connection with FIG. 7. The column 101 is made of a substantially cylindrical outer cylinder 102 as shown in FIG. 7. The inside of the outer cylinder 102 is partitioned into discrete zones by partition walls as the need arises. Vicinities of the center axis of the electron optical column 101 which are in the flight path 105 of the electron beam 103 form an axially continuous space, which is evacuated to a vacuum.

An electron source 104 is mounted inside the electron optical column 101 and emits the electron beam 103. A condenser lens 106 and an objective lens 107 that are electron lenses for diffusing and converging the electron beam 103 utilizing magnetic or electric fields are incorporated in the electron optical column 101. Furthermore, an aperture stop 108 for removing unwanted electrons and shaping the electron beam 103 is mounted in the electron optical column 101. An aperture stop driver 109 for adjusting the position of the aperture stop 108 is also mounted in the column. A specimen holder 111 that is a stage on which the specimen 110 to be observed and analyzed is placed is also mounted in the column.

The specimen holder 111 has a front-end portion disposed inside the specimen chamber 113 located within the electron optical column 101. The specimen 110 is introduced into the specimen chamber 113, where observation and analysis are performed. The specimen chamber 113 is formed inside the objective lens 107.

Figure 1:
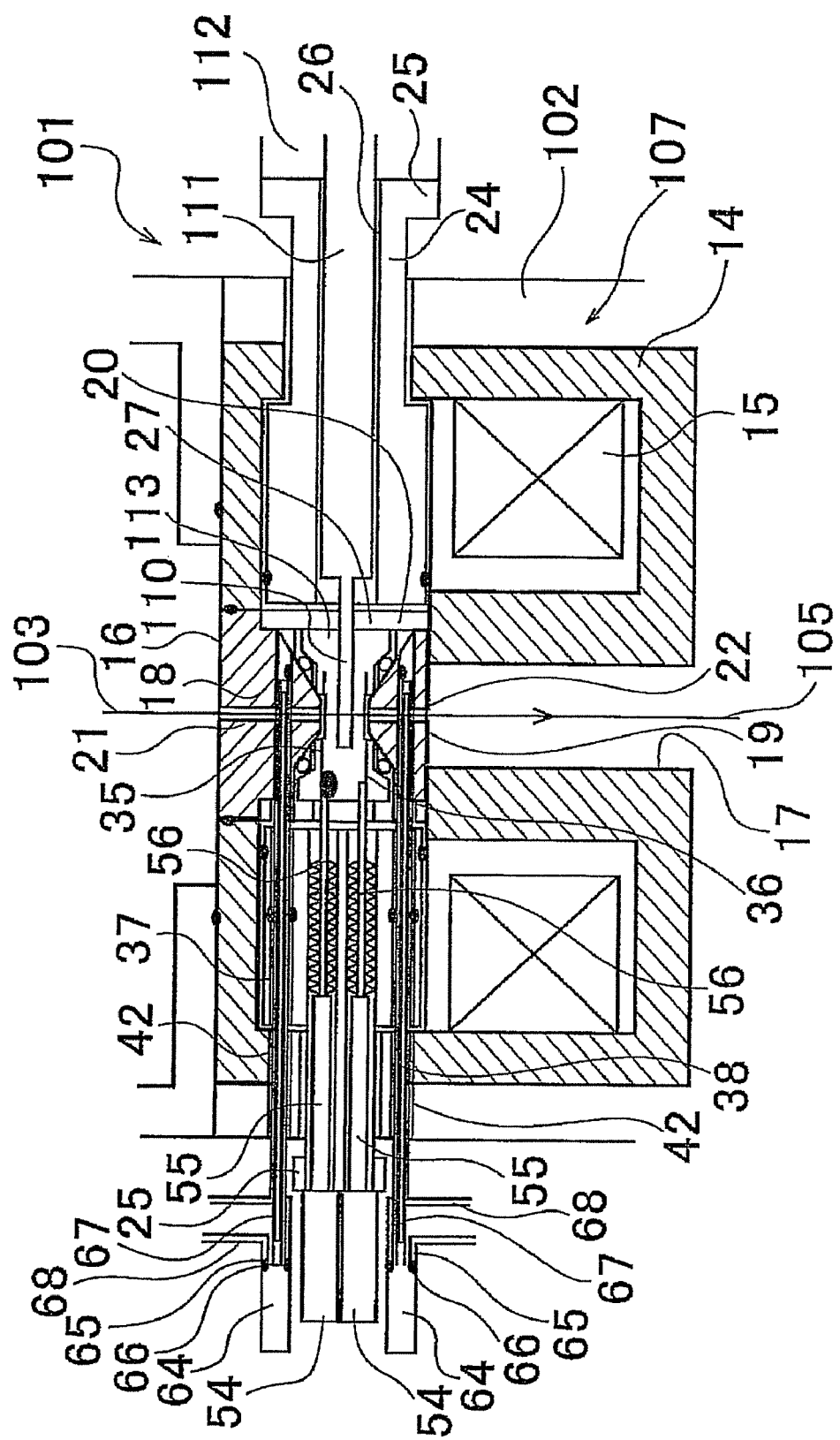
FIG. 1 is a vertical cross section of main portions of a charged-particle beam instrument associated with one embodiment of the present invention, showing the structures of the main portions.

FIG. 1 is a vertical cross section of main portions of a charged-particle beam instrument according to one embodiment of the present invention, showing the structures of the main portions. As shown in FIG. 1, the objective lens 107 is made up of a yoke 14, an excitation coil 15, and a polepiece assembly 16 inside the outer cylinder 102. The yoke 14 is made of a material having a high magnetic permeability. The yoke is fabricated by closing the upper and lower ends of a double cylinder. An upper portion of the inner cylinder has been cut out. A beam passage hole 17 is formed in the center of the yoke 14 and extends in the up-and-down direction. The electron beam 103 passes through the passage hole 17. The excitation coil 15 is received between the two cylinders of the yoke 14. The coil 15 is fabricated by cylindrically winding many turns of a metal wire, such as a copper wire, coated with an insulator.

The polepiece assembly 16 of the objective lens is made of a material having a high magnetic permeability, and is shaped substantially cylindrically. The polepiece assembly 16 of the objective lens is made up of a top polepiece 18, a bottom polepiece 19, and a spacer 20 made of a nonmagnetic material, such as a copper alloy. Each of the top polepiece 18 and bottom polepiece 19 has a protrusive portion obtained by trimming away a conic top portion. The protrusive portions of the top polepiece 18 and the bottom polepiece 19 are opposite to each other and spaced apart a given distance. The top polepiece 18 and bottom polepiece 19 have beam passage holes 21 and 22, respectively, permitting passage of the electron beam 103. The holes 21 and 22 extend in the up-and-down direction. The spacer 20 connects the top polepiece 18 and the bottom polepiece 19 while maintaining the given space between them. The polepiece assembly 16 of the objective lens is mounted in an upper cutout portion of the inner cylinder of the yoke 14.

In the transmission electron microscope, a specimen 110 is inserted in the specimen chamber 113 and observed or analyzed, the chamber 113 being located between the opposite top polepiece 18 and bottom polepiece 19. Inside the yoke 14, a specimen stage 24 made of a nonmagnetic material is mounted at a side of the specimen chamber 113. Plural connection flanges 25 radially extend through the outer cylinder 102 and yoke 14 on the side of the outer periphery of the specimen stage 24. The specimen holder driver 112 and tubes (not shown) for vacuum pumping are held to the connection flanges 25.

The specimen stage 24 is provided with a hole 26 extending through it. The hole 26 is formed to extend toward the specimen chamber 113. The specimen holder 111 can be introduced via the hole 26 to introduce the specimen 110 into the specimen chamber 113 or the specimen chamber 113 can be evacuated to a vacuum. A through-hole 27 for the specimen holder 111 is formed in a side portion of the spacer 20.

Required portions of the joints of the components of the objective lens 107 are hermetically sealed with O-rings. The space around the specimen chamber 113 is maintained as a vacuum.

In the objective lens 107, the specimen chamber 113 is evacuated to a vacuum via the through-hole 26 in the specimen stage 24. The spaces above and below the polepiece assembly 16 of the objective lens are also evacuated to a vacuum with other vacuum pumping piping (described later). In this case, all vacuum pipes are independent vacuum pumping systems.

Figure 2:
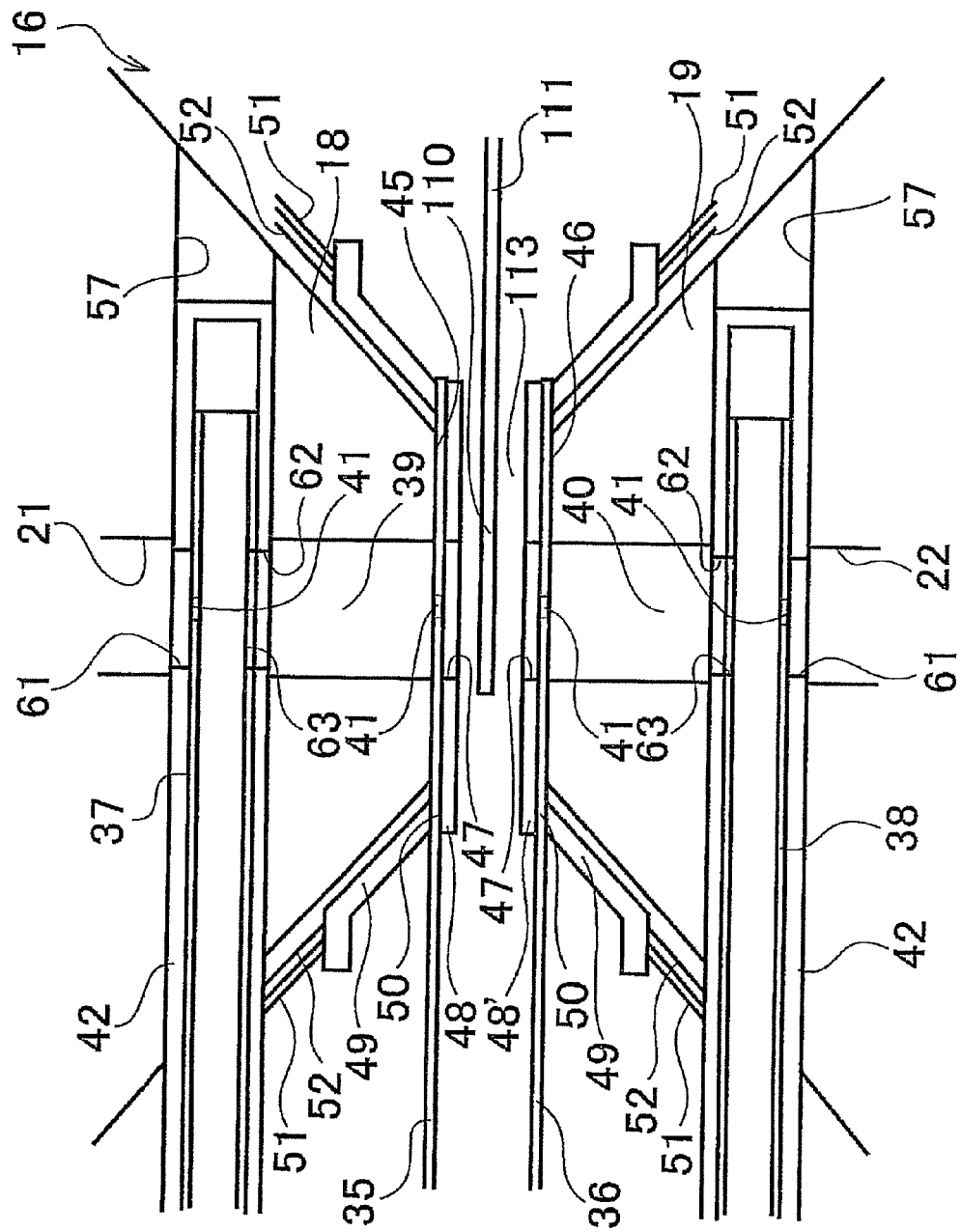
FIG. 2 is a vertical cross section of a specimen chamber formed in the charged-particle beam instrument showing the configuration of the specimen chamber.

FIG. 2 is a vertical cross section of the specimen chamber of the charged-particle beam instrument associated with the present invention, showing the configuration of the specimen chamber. The objective lens 107 has the polepiece assembly 16 including the top polepiece 18 and bottom polepiece 19. As shown in FIG. 2, the polepieces 18 and 19 have flat portions facing the specimen 110. The flat portions are referred to as top-polepiece vertex surface 45 and bottom-polepiece vertex surface 46, respectively. An upper stop-pushing plate 48 forming a first pushing mechanism is placed in intimate contact with the top-polepiece vertex surface 45. The upper stop-pushing plate 48 is made of a nonmagnetic metal material and assumes a form of a flat plate. The pushing plate 48 is provided with a beam passage hole 47 in a portion corresponding to the beam passage hole 21 in the top polepiece 18. The beam passage hole 47 in the upper stop-pushing plate 48 is large enough to enable normal usage of the TEM. A pair of handle-like portions 49 extends upwardly and externally from the flat surface of the upper stop-pushing plate 48 in intimate contact with the top-polepiece vertex surface 45. A first upper stop insertion hole 50 that is a horizontally elongated slit is formed in the side surface of each handle-like portion 49. A first upper aperture stop 35 is inserted into the first upper aperture stop insertion holes 50.

The handle-like portions 49 of the upper stop-pushing plate 48 are connected to the spacer 20 near the top portion of the top polepiece 18 via two pairs of tension springs 51 constituting a second pushing mechanism. The upper stop-pushing plate 48 is pushed into intimate contact with the top-polepiece vertex surface 45 by the tensile force from the tension springs 51.

A pair of actuators 52 forming a third pushing mechanism utilizing a piezoelectric device, for example, is mounted between the handle-like portions 49 of the upper stop-pushing plate 48 and the spacer 20 such that almost no electric or magnetic field is produced during operation. When the actuators 52 are not in operation, the upper stop-pushing plate 48 is kept in intimate contact with the top-polepiece vertex surface 45. During operation of the actuators 52, respective one ends of the actuators 52 push down their respective handle-like portions 49, bringing the upper stop-pushing plate 48 out of intimate contact with the top-polepiece vertex surface 45. As a result, a slight gap is formed between the plate 48 and the vertex surface 45. The actuators 52 can be operated in a sequence opposite to the above-described sequence of operations. Preferably, the tension springs 51 and actuators 52 are made of a feebly magnetic material or nonmagnetic conductive material that affects neither the magnetic field produced by the objective lens 107 nor the electron beam 103.

The bottom polepiece 19 is similar in structure with the top polepiece 18. The bottom polepiece 19 and top polepiece 18 are arranged symmetrically with respect to the specimen 110. That is, a bottom stop-pushing plate 48' is placed in intimate contact with the bottom polepiece vertex surface 46 of the bottom polepiece 19.

Figure 3:
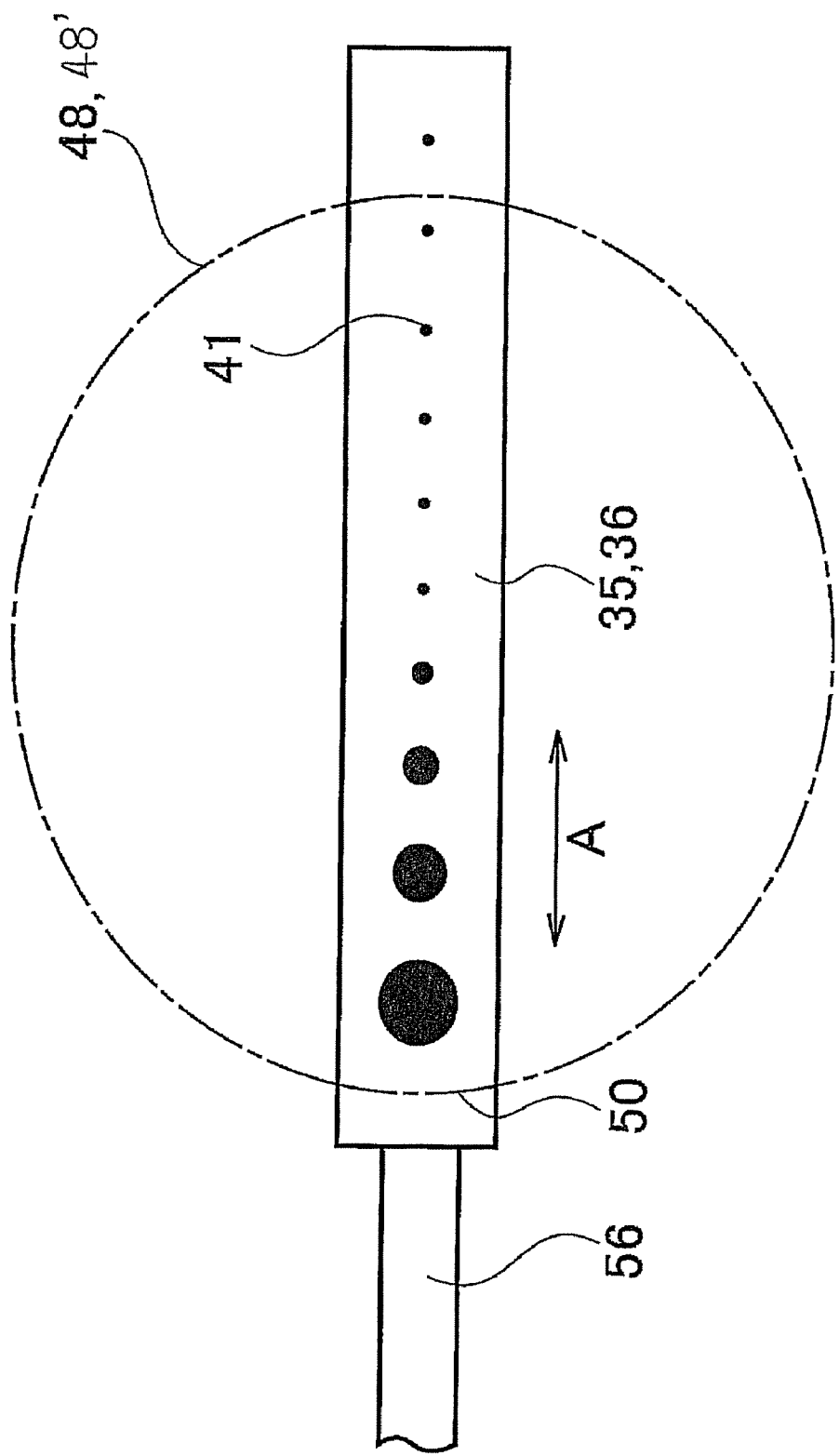
FIG. 3 is a plan view of first aperture stops included in the charged-particle beam instrument associated with the invention, showing the structures of the first aperture stops.

FIG. 3 is a plan view of the first aperture stops of the charged-particle beam instrument associated with the present invention, showing the structures of the first aperture stops. The first aperture stop 35 is sandwiched between the top-polepiece vertex surface 45 and the upper stop-pushing plate 48. The first lower aperture stop 36 is sandwiched between the bottom polepiece vertex surface 46 and the lower stop-pushing plate 48'. As shown in FIG. 3, each of the first aperture stops 35 and 36 is provided with plural aperture holes 41 and shaped like stripes. The first aperture stops 35 and 36 are inserted between the polepiece vertex surfaces 45, 46 and the stop-pushing plates 48, 48' from the first upper and lower stop insertion holes 50. The first aperture stops 35 and 36 are made of nonmagnetic metal foil or sheet. The aperture holes 41 in the first aperture stops 35 and 36 are formed along the longitudinal center line. One of the aperture holes 41 is comparable in size with the beam passage holes 47 in the stop-pushing plates 48 and 48' and used as an open hole. The remaining aperture holes 41 can have any arbitrary size but are smaller than the beam passage holes 47 in the stop-pushing plates 48 and 48'. According to desired operation conditions, plural hole diameters may be selected for the aperture holes 41, and the holes 41 may be machined. It is not required that the beam passage holes 41 in the first upper aperture stop 35 be identical in size and number with the beam passage holes 41 in the first lower aperture stop 36.

The tensile springs 51, actuators 52, and first aperture stops 35, 36 are preferably arranged such that they are made parallel as much as possible to the axis of the specimen holder 111 to prevent the operation of the specimen holder 111 consisting of rotating about its axis and tilting.

As shown in FIG. 1, respective one ends of the first upper and lower aperture stops 35 and 36 are connected to first upper and lower aperture stop position-adjusting devices 54 constituting aperture stop drive mechanisms. The first aperture stop position-adjusting devices 54 introduce a connection shaft 56 into the vacuum via a member capable of being deformed while maintaining the airtightness, such as bellows 55 (see FIG. 1). The bellows have front-end portions connected with the first upper and lower aperture stops 35 and 36. The stop position-adjusting devices 54 are hermetically held to the connection flanges 25.

In this charged-particle beam instrument, the first upper and lower aperture stops 35 and 36 can be moved in a direction perpendicular to the path of the electron beam 103 as indicated by the arrow A in FIG. 3 by manipulating the first aperture stop position-adjusting devices 54 from outside of the enclosure or column 101. Thus, the positions can be adjusted.

The charged-particle beam instrument further includes a second upper aperture stop 37 and a second lower aperture stop 38 as shown in FIG. 2. The second aperture stops 37 and 38 are cylindrically-shaped members and have front-end portions that are open. The second aperture stops 37 and 38 are inserted in upper and lower differential pumping tubes 42 and in the top and bottom polepieces 18 and 19, respectively. That is, the differential pumping tubes 42 are tubular and have closed front-end portions. Top and bottom polepiece venting holes 57 extend through side surfaces of the top and bottom polepieces 18 and 19, respectively. The pumping tubes 42 are inserted in the venting holes 57, respectively. The venting holes 57 intersect the beam passage holes 21 and 22 in the top and bottom polepieces 18 and 19, respectively. Hermeticity is maintained between the pumping tubes 42 and polepieces 18, 19 by O-rings. The second upper and lower aperture stops 37 and 38 are inserted in the upper and lower differential pumping tubes 42, respectively.

The portions of the differential pumping tubes 42 which intersect the beam passage holes 21 and 22 are provided with upper and lower differential pumping tube holes 61 and 62, respectively, which are large enough to enable normal use of the TEM. Preferably, the differential pumping tube hole 62 on the side of the specimen chamber 113 is maximized in size.

The second upper and lower aperture stops 37 and 38 have front-end portions inserted in the top and bottom polepieces 18 and 19, respectively. The other ends of the aperture stops 37 and 38 are closed. The relationship of the outside diameter of the second aperture stops 37 and 38 relative to the inside diameter of the upper and lower differential pumping tubes 42 is so set that the second aperture stops 37 and 38 are slidably fitted in the pumping tubes 42 with a minimum gap therebetween. The second upper and lower aperture stops 37 and 38 are provided with the aperture holes 41 on the sides of the upper holes 61 of the differential pumping tubes, the aperture holes 61 being on the opposite side of the specimen chamber 113. The second upper and lower aperture stops 37 and 38 are provided with upper and lower intermediate chamber venting holes 63 on the side of the specimen chamber 113. Preferably, the diameters of the venting holes 63 are maximized.

The closed other ends of the upper and lower second aperture stops 37 and 38 are brought out of the objective lens 107 as shown in FIG. 1 and connected with the second upper and lower aperture stop position-adjusting devices 64, respectively. The positions of the aperture holes 41 in the second aperture stops 37 and 38 can be adjusted by manipulating the second aperture stop position-adjusting devices 64. The aperture stop position-adjusting devices 64 are connected with connection ports 65 formed in the upper and lower differential pumping tubes 42 while the airtightness is maintained by O-rings 66.

Vicinities of the connection ports 65 in the upper and lower differential pumping tubes 42 are connected to the vacuum pipe 68. Venting holes 67 opening into the vacuum pipe 68 are formed in side surfaces of the second upper and lower aperture stops 37 and 38 on the other side.

Preferably, the second aperture stops 37 and 38 and the differential pumping tubes 42 are made of a feebly magnetic material or nonmagnetic conductive material that affects neither the magnetic field produced by the objective lens 107 nor the electron beam 103.

Where the charged-particle beam instrument is used as a normal transmission electron microscope, the actuators 52 are driven to place the upper and lower aperture stop-pushing plates 48 and 48' at a distance of about tens of micrometers to hundreds of micrometers from the top and bottom polepiece surfaces 45 and 46. The first upper and lower aperture stops 35 and 36 are opened to make them movable. The first upper and lower aperture stop position-adjusting devices 54 are manipulated to align the open holes in the first upper and lower aperture stops 35 and 36 with the beam passage holes 21 and 22 in the top and bottom polepieces 18 and 19. After completion of the alignment, the actuators 52 are stopped from being driven. The first upper and lower aperture stops 35 and 36 are again held to the top and bottom polepiece surfaces 45 and 46 by the upper and lower aperture stop-pushing plates 48 and 48', respectively. That is, the first upper and lower aperture stops 35 and 36 are disposed to cover the open ends of the beam passage holes in the top and bottom polepieces 18 and 19 which face into the specimen chamber.

The second upper and lower aperture stops 37 and 38 are slid within the upper and lower differential pumping tubes 42 outwardly of the objective lens 107 by manipulating the second upper and lower aperture stop position-adjusting devices 64 until the front ends of the second aperture stops 37 and 38 come close to the outer peripheries of the beam passage holes 21 and 22 in the top and bottom polepieces 18 and 19.

Because of the operations described so far, the beam passage holes 21 and 22 are opened to a sufficient degree, together with the top polepiece 18 and bottom polepiece 19. The transmission electron microscope can be used by a normal method of microscopic examination. In this case, the aperture holes 41 can be used as an ordinary aperture stop for cutting out a part of the electron beam 103 or shaping it by moving any one of the first upper and lower aperture stops 35 and 36 by a procedure similar to the foregoing procedure and bringing the aperture holes 41 onto the flight path 105 of the electron beam 103.

Where the specimen 110 is observed and analyzed under an ambient of a gas, the gas is supplied into the specimen chamber 113. The first upper and lower aperture stops 35 and 36 are then moved by a procedure similar to the foregoing procedure to align arbitrary small aperture holes 41 with the beam passage holes 21 and 22, respectively. At this time, the first upper aperture stops 35 and 36 are pushed into intimate contact with the top and bottom polepiece surfaces 45 and 46, respectively, by the flat portions of the stop-pushing plates 48 and 48', respectively. Consequently, it is possible to have large pumping resistance (conductance).

The second upper and lower aperture stops 37 and 38 are slid inwardly of the objective lens 107 and inserted into it within the upper and lower differential pumping tubes 42 by manipulating the second upper and lower aperture position-adjusting devices 64 to align the aperture holes 41 with the centers of the beam passage holes 21 and 22 in the top and bottom polepieces 18 and 19, respectively.

The evacuated inside of the electron optical column 101 is divided into the specimen chamber 113, an upper middle chamber 39 (located between the first upper aperture stop 35 and the second upper aperture stop 37), a lower middle chamber 40 (located between the first lower aperture stop 36 and the second lower aperture stop 38), and vacuum chambers located, respectively, above and below the polepiece assembly 16 of the objective lens as shown in FIG. 2 because of the operations described so far. These chambers are connected to each other with large pumping resistance via the aperture holes 41. Accordingly, the specimen 110 can be observed and analyzed under an ambient of an arbitrary gas such that the degrees of vacuum in the vacuum chambers located, respectively, above and below the polepiece assembly 16 of the objective lens are hardly deteriorated, even if a trace amount of the arbitrary gas is introduced into the specimen chamber 113, by adjusting the pumping speeds in the vacuum chambers, respectively.

Second Embodiment

In the charged-particle beam instrument associated with the present invention, the first upper aperture stop 35 and the first lower aperture stop 36 may be plated with a soft metal, such as gold. In this case, the degree of intimateness between the first upper aperture stop 35 and the first lower aperture stop 36 can be improved. Similarly, the degree of intimateness between the top-polepiece vertex surface 45 and the bottom-polepiece vertex surface 46 can be improved.

Third Embodiment

In the charged-particle beam instrument associated with the present invention, the aperture holes 41 formed in the first upper aperture stops 35 and 36 may be all identical in diameter. In this case, where the aperture hole 41 used during microscopic examination is contaminated by the effects of the introduced gas, the used aperture hole 41 may be exchanged in turn by the procedure described above.

Fourth Embodiment

Figure 4:
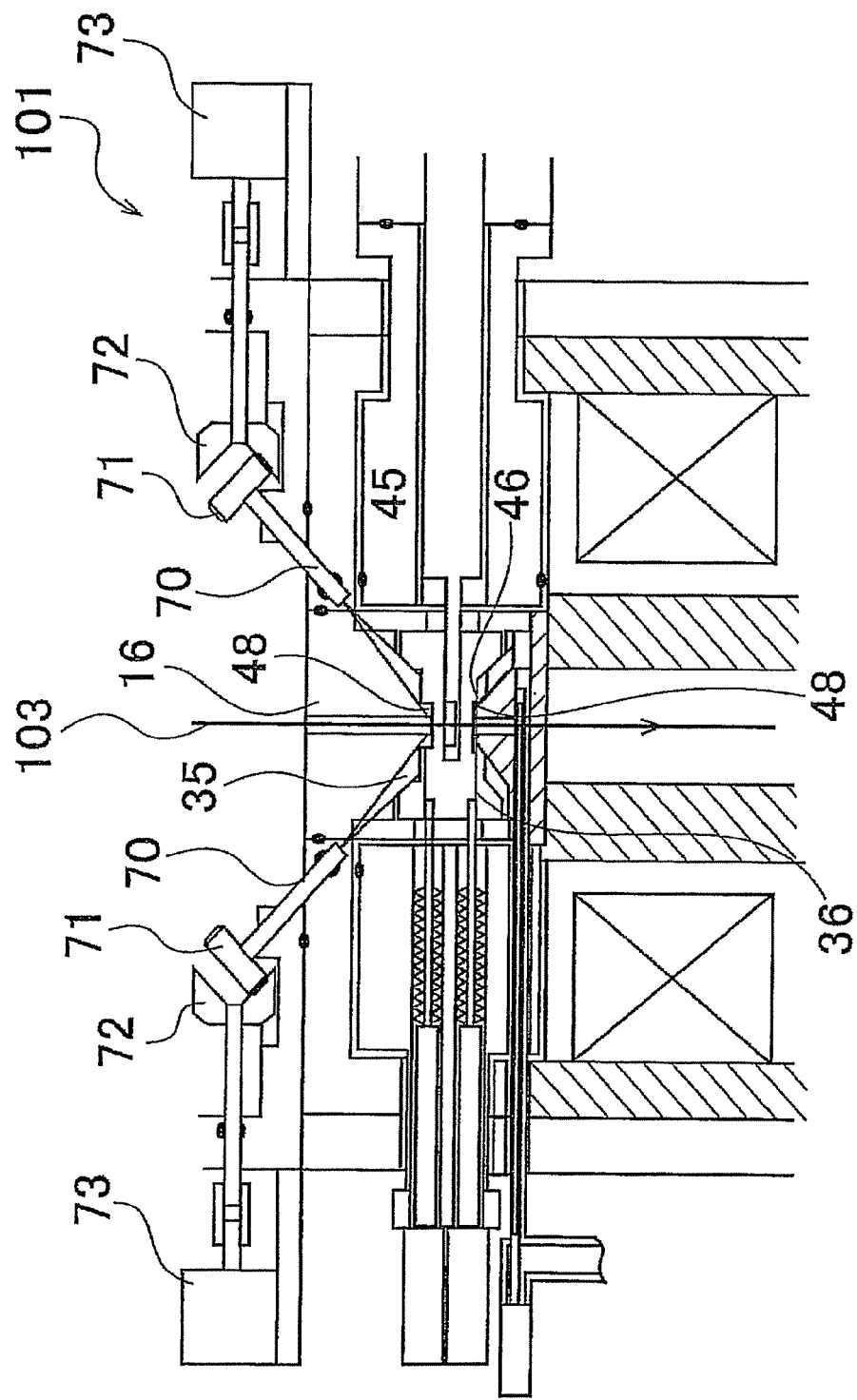
FIG. 4 is a vertical cross section of main portions of a fourth embodiment of the charged-particle beam instrument showing the structures of the main portions.

FIG. 4 is a vertical cross section of main portions of a fourth embodiment of the charged-particle beam instrument associated with the present invention, showing the structures of the main portions. As shown in FIG. 4, in the charged-particle beam instrument associated with the present invention, driving shafts 70 may be introduced into the electron optical column 101 from obliquely above instead of the actuators 52, and the upper aperture stop-pushing plate 48 may be manipulated by screws 71 and gears 72 via the driving shafts 70. The gears 72 are driven by motors 73 disposed outside the electron optical column 101. Preferably, the motors 73 are spaced from the electron optical column 101 by a large distance where the electron beam 103 is not affected.

In this case, the gears 72 are rotated by the motors 73. This, in turn, rotates the driving shafts 70. The screws 71 cause the driving shafts 70 to move the upper aperture stop-pushing plates 48. These operations create gaps between the upper aperture stop-pushing plates 48 and the polepiece vertex surfaces 45, 46. Consequently, the first upper aperture stops 35 and 36 are freed. Conversely, the first upper aperture stops 35 and 36 can be held by moving the upper aperture stop-pushing plates 48 toward the polepiece vertex surfaces 45 and 46 by means of the driving shafts 70.

Fifth Embodiment

Figure 5:
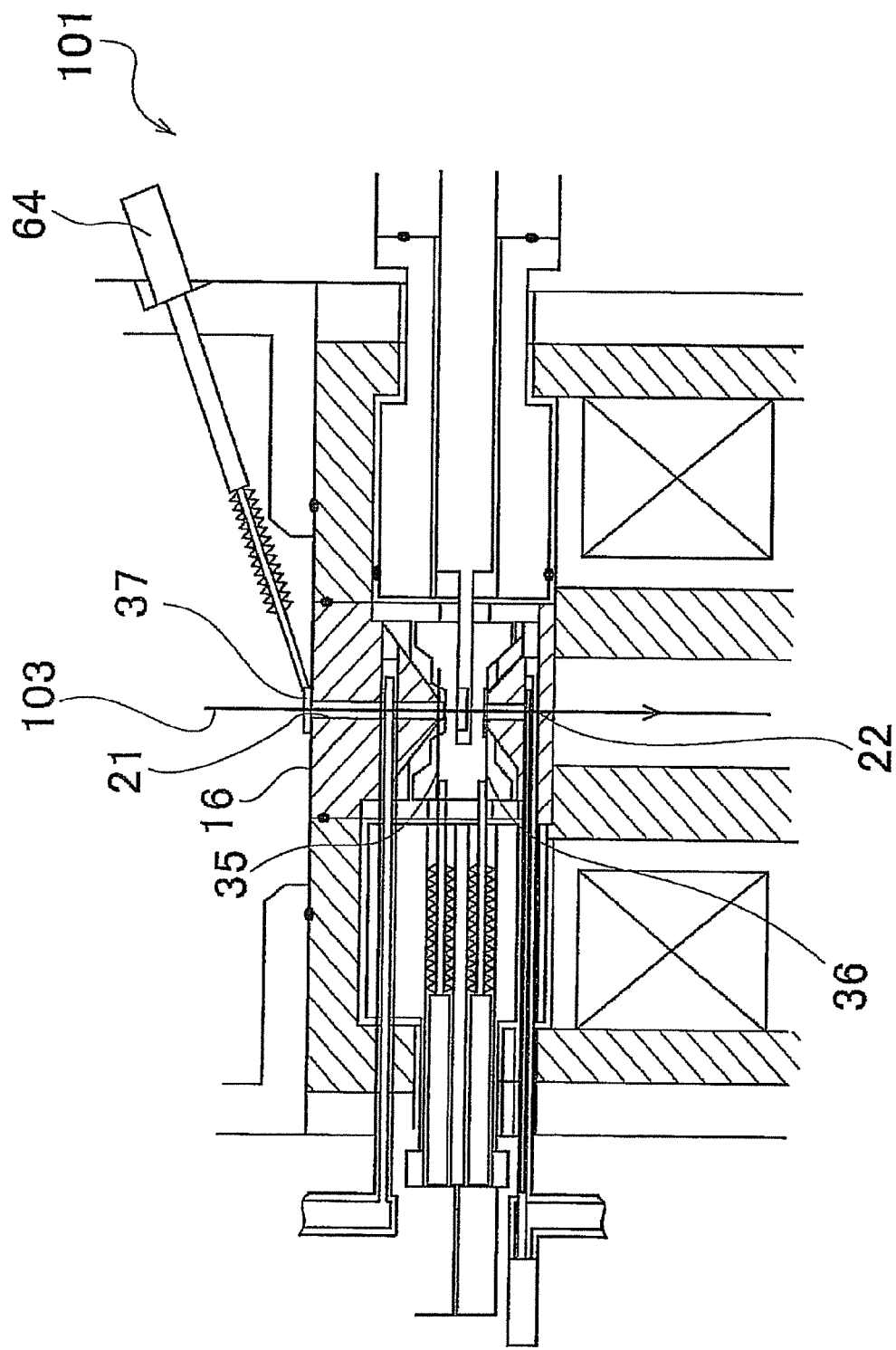
FIG. 5 is a vertical cross section of main portions of a fifth embodiment of the charged-particle beam instrument showing the structures of the main portions.

FIG. 5 is a vertical cross section of main portions of a fifth embodiment of the charged-particle beam instrument associated with the present invention, showing the structures of the main portions. As shown in FIG. 5, in the charged-particle beam instrument associated with the present invention, a second lower aperture stop 37 may be introduced into the electron optical column 101 from obliquely above it and placed at a position located above the objective lens 107. In this case, the second lower aperture stop 37 is moved by manipulating the second aperture stop position-adjusting device 64 that is located outside the electron optical column 101 and supports the second lower aperture stop 37. The second lower aperture stop 37 can be switched between a state in which the aperture stop is located over the beam passage holes 21 and 22 and a state in which the stop is located not over the beam passage holes 21 and 22.

Sixth Embodiment

Figure 6:
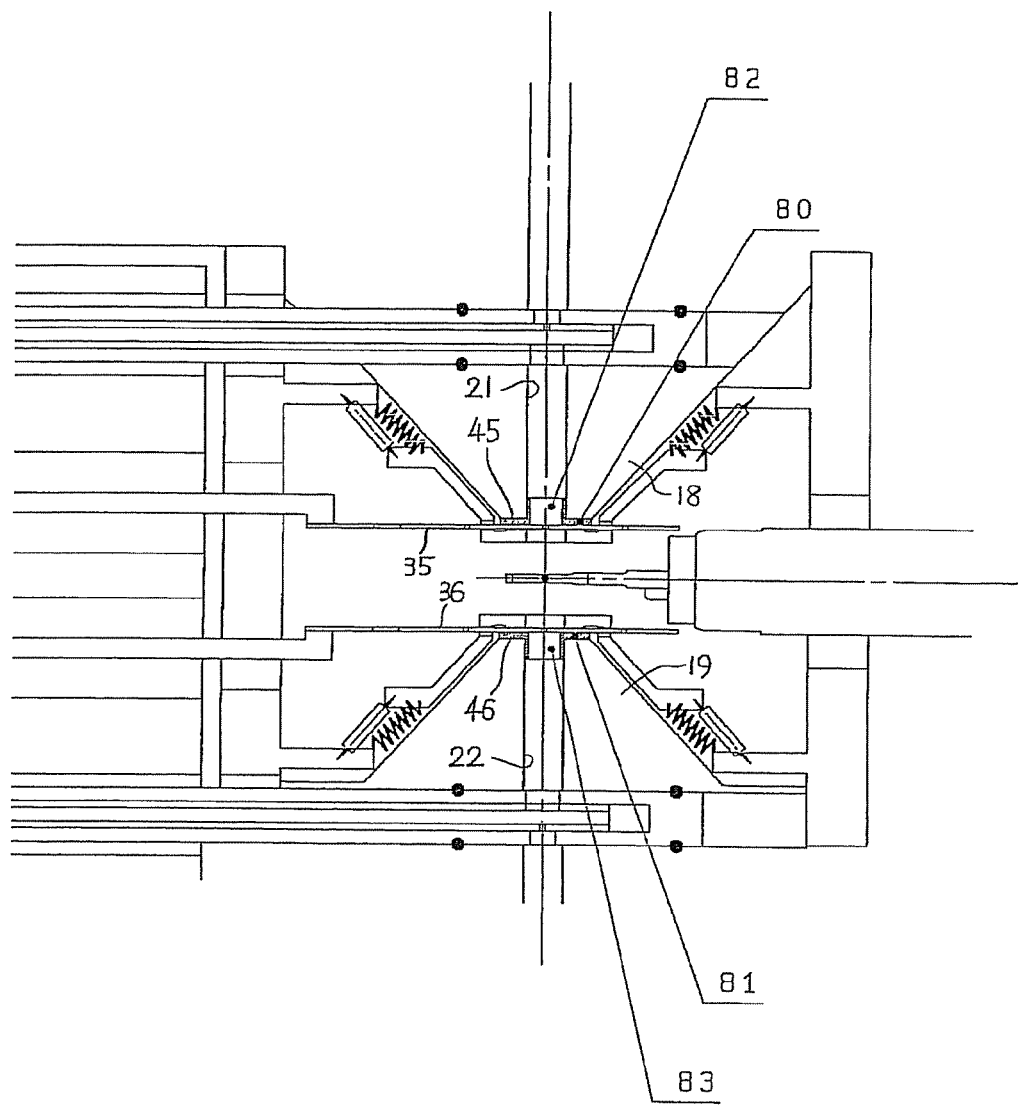
FIG. 6 is a vertical cross section of main portions of a sixth embodiment of the charged-particle beam instrument showing the structures of the main portions.

FIG. 6 is a vertical cross section similar to the cross section of FIG. 2, but showing the structures of main portions of a sixth embodiment of the charged-particle beam instrument associated with the present invention.

Disk-like or otherwise shaped components are mounted to cover the vertex surfaces 45 and 46 of the top polepiece 18 and bottom polepiece 19. The component mounted over the top-polepiece vertex surface 45 is referred to as the top-polepiece protective plate 80. The component mounted over the bottom-polepiece vertex surface 46 is referred to as the bottom-polepiece protective plate 81. The protective plates 80 and 81 are substantially centrally provided with holes 82 and 83, respectively, extending through the plates. The holes 82 and 83 permit passage of the electron beam and vacuum pumping. The holes 82 and 83 are comparable in size with the beam passage holes 21 and 22 formed in the top polepiece 18 and bottom polepiece 19. The holes 82 and 83 are so sized that the pumping resistances in the beam passage holes 21 and 22 are not greatly deteriorated. The polepiece protective plates 80 and 81 are made of a nonmagnetic conductive material. The protective plates 80 and 81 are bonded to the top-polepiece vertex surface 45 and bottom-polepiece vertex surface 46, for example, with a conductive adhesive such that the joints are made hermetic.

Because the shapes of the top-polepiece vertex surface 45 and bottom-polepiece vertex surface 46 are determined by electron optics calculations, it is difficult to enhance the degree of intimateness when the first upper aperture holes 35 and 36 are pressed against the polepiece vertex surfaces 45, 46 by devising the shapes of the vertex surfaces 45, 46. Furthermore, some restrictions are imposed on the used material. Therefore, it is also difficult to make contrivances to enhance the degree of intimateness, for example, by taking account of the hardness.

Accordingly, the top-polepiece protective plate 80 and bottom-polepiece protective plate 81 made of a nonmagnetic material, i.e., do not play a role as magnetic poles, are hermetically held to the top-polepiece vertex surface 45 and bottom-polepiece vertex surface 46. Consequently, the shapes of the surfaces pressed against the first upper aperture stops 35 and 36, their hardness, and surface treatment can be devised. When the first upper aperture stops 35 and 36 are pressed against the vertex surfaces, the airtightness can be enhanced. At the same time, contamination of the polepiece vertex surfaces 45 and 46 due to introduction of a gas can be prevented. In addition, abrasion and scratching due to fretting of the first upper and lower aperture stops 35 and 36 can be prevented.

Having thus described my invention with the detail and particularity required by the Patent Laws, what is desired protected by Letters Patent is set forth in the following claims.

The invention claimed is:

1. A charged-particle beam instrument for observing or analyzing a specimen by receiving the specimen in a specimen chamber formed in an electron optical column and irradiating the specimen with an electron beam, said charged-particle beam instrument comprising:
   top and bottom polepieces disposed on the beam entrance side and the exit side, respectively, of the specimen chamber and provided with beam passage holes, the top and bottom polepieces forming the specimen chamber;
   an upper aperture stop made of metal foil or sheet having plural holes, the upper aperture stop being located on a side of an opening end of the beam passage hole in the top polepiece that faces into the specimen chamber, the top polepiece being located on the beam entrance side of the specimen chamber;
   a first pushing mechanism for pushing the upper aperture stop toward the top polepiece and supporting the upper aperture stop, the pushing mechanism stopping from pushing the upper aperture stop toward the top polepiece in response to a manipulation performed outside the electron optical column;
   an upper aperture stop drive mechanism for sliding the upper aperture stop in a direction perpendicular to a path of the electron beam in response to a manipulation performed outside the electron optical column;
   a lower aperture stop made of metal foil or sheet having plural holes, the lower aperture stop being located on a side of an opening end of the beam passage hole in the bottom polepiece that faces into the specimen chamber, the bottom polepiece being located on the beam exit side of the specimen chamber;
   a second pushing mechanism for pushing the lower aperture stop toward the bottom polepiece and supporting the lower aperture stop, the second pushing mechanism stopping from pushing the lower aperture stop toward the bottom polepiece in response to a manipulation performed outside the electron optical column; and
   a lower aperture stop drive mechanism for sliding the lower aperture stop in the direction perpendicular to the path of the electron beam in response to a manipulation performed outside the electron optical column.

2. A charged-particle beam instrument as set forth in claim 1, further comprising a second upper aperture stop disposed over the beam passage hole in said top polepiece and a second lower aperture stop disposed over the beam passage hole formed in the bottom polepiece, and a first space being formed between the first-mentioned upper aperture stop and the second upper aperture stop, a second space being formed between the first-mentioned lower aperture stop and the second lower aperture stop, and independent pumping means for evacuating the first space, second space, and specimen chamber.

3. A charged-particle beam instrument as set forth in claim 2, further comprising means for supplying gas into the specimen chamber.

4. A charged-particle beam instrument as set forth in claim 1, further comprising means for supplying gas into the specimen chamber.

* * * * *